(12) United States Patent
Olsson

(10) Patent No.: US 12,395,027 B2
(45) Date of Patent: Aug. 19, 2025

(54) INDUCTION MACHINE

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 245 days.

(21) Appl. No.: 17/997,915

(22) PCT Filed: May 5, 2021

(86) PCT No.: PCT/EP2021/061831
§ 371 (c)(1),
(2) Date: Nov. 3, 2022

(87) PCT Pub. No.: WO2021/224322
PCT Pub. Date: Nov. 11, 2021

(65) Prior Publication Data
US 2023/0146820 A1 May 11, 2023

(30) Foreign Application Priority Data
May 7, 2020 (EP) .................... 20173414

(51) Int. Cl.
*H02K 3/28* (2006.01)
*H02K 17/14* (2006.01)
(Continued)

(52) U.S. Cl.
CPC ............... *H02K 3/28* (2013.01); *H02K 17/14* (2013.01); *H02P 25/22* (2013.01); *H03B 5/24* (2013.01);
(Continued)

(58) Field of Classification Search
CPC .......... H02K 3/28; H02K 17/14; H02P 25/22; H02P 2207/01; H02P 2101/30; H03B 5/24
See application file for complete search history.

(56) References Cited

U.S. PATENT DOCUMENTS

| 2,463,073 A | 3/1949 | Webb |
| 4,103,325 A | 7/1978 | Hyman et al. |

(Continued)

FOREIGN PATENT DOCUMENTS

| CN | 1599099 | 3/2005 |
| CN | 101621292 | 5/2012 |

(Continued)

OTHER PUBLICATIONS

International Search Report and Written Opinion of PCT/EP2021/061831, dated Jun. 7, 2021 in 13 pages.

(Continued)

*Primary Examiner* — Forrest M Phillips
(74) *Attorney, Agent, or Firm* — Knobbe, Martens, Olson & Bear, LLP

(57) ABSTRACT

There is provided an induction machine (100) comprising a rotor (120); a stator (140); and a phase-shift oscillator (160). The stator comprises: a first winding (141); and a second winding (142), arranged at a first angle (101) relative to said first winding. The phase-shift oscillator comprises: a transistor (170), the transistor (170) being a high-electron mobility transistor, HEMT; and a phase-shift network (180). The first winding is connected to a first node (181) of the phase-shift network and wherein the second winding is connected to a second node (182) of the phase-shift network, wherein the phase-shift oscillator is configured to provide a first phase electric signal at the first node and a second phase electric signal at the second node, wherein a difference between the first and second phase corresponds to the first angle. There is also provided an electric aircraft propulsion system comprising the induction machine.

16 Claims, 7 Drawing Sheets

(51) Int. Cl.
   *H02P 25/22* (2006.01)
   *H02P 101/30* (2015.01)
   *H03B 5/24* (2006.01)
(52) U.S. Cl.
   CPC ...... *H02P 2101/30* (2015.01); *H02P 2207/01* (2013.01)

(56) References Cited

U.S. PATENT DOCUMENTS

| | | | |
|---|---|---|---|
| 4,873,497 | A | 10/1989 | Kielmeyer |
| 5,362,972 | A | 11/1994 | Yazawa et al. |
| 5,976,957 | A | 11/1999 | Westwater et al. |
| 6,306,734 | B1 | 10/2001 | Givargizov |
| 6,734,451 | B2 | 5/2004 | Eriguchi et al. |
| 7,250,359 | B2 | 7/2007 | Fitzgerald |
| 7,432,522 | B2 | 10/2008 | Samuelson et al. |
| 7,829,362 | B2 | 11/2010 | Fukutani et al. |
| 8,094,223 | B1 | 1/2012 | De Wit et al. |
| 8,324,660 | B2 | 12/2012 | Lochtefeld et al. |
| 8,344,242 | B2 | 1/2013 | Fiorenza et al. |
| 8,835,905 | B2 | 9/2014 | Wober et al. |
| 9,000,353 | B2 | 4/2015 | Seo et al. |
| 9,275,857 | B1 | 3/2016 | Hersee |
| 9,379,204 | B2 | 6/2016 | Fogel et al. |
| 9,406,709 | B2 | 8/2016 | Seo et al. |
| 9,764,950 | B2 | 9/2017 | Colinge et al. |
| 9,887,637 | B1 | 2/2018 | Shah et al. |
| 9,979,326 | B1* | 5/2018 | Zanelato ............... H02P 1/42 |
| 9,984,872 | B2 | 5/2018 | Park et al. |
| 10,263,149 | B2 | 4/2019 | Samuelson et al. |
| 10,387,792 | B1 | 8/2019 | Ladd et al. |
| 10,439,671 | B2 | 10/2019 | Kamgaing et al. |
| 10,742,208 | B1 | 8/2020 | Moyer et al. |
| 11,316,165 | B2 | 4/2022 | Olsson |
| 11,469,300 | B2 | 10/2022 | Olsson |
| 11,634,824 | B2 | 4/2023 | Olsson |
| 11,652,454 | B2 | 5/2023 | Olsson |
| 11,695,066 | B2 | 7/2023 | Olsson |
| 11,955,972 | B2 | 4/2024 | Olsson |
| 12,009,431 | B2 | 6/2024 | Olsson |
| 12,027,989 | B2 | 7/2024 | Olsson |
| 12,068,726 | B2 | 8/2024 | Olsson |
| 12,148,821 | B2 | 11/2024 | Olsson |
| 2003/0022395 | A1 | 1/2003 | Olds |
| 2003/0165418 | A1 | 9/2003 | Ajayan |
| 2005/0064291 | A1 | 3/2005 | Sato et al. |
| 2005/0159000 | A1 | 7/2005 | Ohno et al. |
| 2005/0189566 | A1 | 9/2005 | Matsumoto et al. |
| 2006/0134883 | A1 | 6/2006 | Hantschel |
| 2006/0189018 | A1 | 8/2006 | Yi |
| 2006/0216815 | A1 | 9/2006 | Cheng et al. |
| 2007/0108435 | A1 | 5/2007 | Harmon |
| 2007/0197396 | A1* | 8/2007 | Holcomb ............. H10N 60/202 505/400 |
| 2007/0215899 | A1 | 9/2007 | Thomas |
| 2007/0277866 | A1 | 12/2007 | Sander et al. |
| 2007/0295993 | A1 | 12/2007 | Chen et al. |
| 2008/0001169 | A1 | 1/2008 | Lochtefeld |
| 2008/0122418 | A1 | 5/2008 | Biere et al. |
| 2008/0153000 | A1 | 6/2008 | Salot et al. |
| 2008/0171424 | A1 | 7/2008 | Li |
| 2009/0269909 | A1 | 10/2009 | Kim |
| 2010/0097027 | A1* | 4/2010 | Jackson ................. H02P 27/06 310/112 |
| 2010/0176459 | A1 | 7/2010 | Wernersson et al. |
| 2010/0259186 | A1 | 10/2010 | Ernoux |
| 2010/0276664 | A1 | 11/2010 | Hersee |
| 2010/0276665 | A1 | 11/2010 | Wang |
| 2010/0314617 | A1 | 12/2010 | Ito |
| 2011/0020704 | A1 | 1/2011 | Fukuchi |
| 2011/0036396 | A1 | 2/2011 | Jayaraman |
| 2011/0140072 | A1 | 6/2011 | Varangis |
| 2011/0143472 | A1 | 6/2011 | Seifert |
| 2011/0204381 | A1 | 8/2011 | Okada et al. |
| 2011/0233575 | A1 | 9/2011 | Huang et al. |
| 2011/0253187 | A1 | 10/2011 | Ohta et al. |
| 2011/0305950 | A1 | 12/2011 | Kuriki et al. |
| 2012/0001153 | A1 | 1/2012 | Hersee |
| 2012/0052560 | A1 | 3/2012 | Knight et al. |
| 2012/0235117 | A1 | 9/2012 | Takashi et al. |
| 2012/0292592 | A1 | 11/2012 | Hwang et al. |
| 2013/0061747 | A1 | 3/2013 | Turnbull et al. |
| 2013/0126907 | A1 | 5/2013 | Kitano et al. |
| 2013/0175501 | A1 | 7/2013 | Hersee |
| 2013/0187627 | A1 | 7/2013 | Imada et al. |
| 2013/0292683 | A1 | 11/2013 | Shah |
| 2014/0008609 | A1 | 1/2014 | Chiu |
| 2014/0078781 | A1 | 3/2014 | Imada |
| 2014/0134773 | A1 | 5/2014 | Rakesh et al. |
| 2014/0183446 | A1 | 7/2014 | Nago et al. |
| 2014/0197130 | A1 | 7/2014 | Lemke |
| 2014/0231870 | A1 | 8/2014 | Hoke |
| 2014/0239346 | A1 | 8/2014 | Green et al. |
| 2015/0014631 | A1 | 1/2015 | Ohlsson |
| 2015/0060996 | A1 | 3/2015 | Colinge |
| 2015/0076450 | A1 | 3/2015 | Weman |
| 2015/0084685 | A1 | 3/2015 | Hirose et al. |
| 2015/0118572 | A1 | 4/2015 | Lund et al. |
| 2015/0155275 | A1 | 6/2015 | Bahramian et al. |
| 2015/0171784 | A1* | 6/2015 | Lipo ..................... H02P 21/22 318/729 |
| 2015/0236134 | A1 | 8/2015 | Zhong et al. |
| 2015/0263100 | A1 | 9/2015 | Deboy |
| 2015/0311072 | A1 | 10/2015 | Aagesen |
| 2015/0318448 | A1 | 11/2015 | Nan et al. |
| 2015/0333216 | A1 | 11/2015 | Pourquire |
| 2016/0172305 | A1 | 6/2016 | Sato |
| 2016/0211789 | A1* | 7/2016 | Hanft ..................... H02K 11/27 |
| 2016/0276433 | A1 | 9/2016 | Holland |
| 2017/0002471 | A1 | 1/2017 | Okamoto |
| 2017/0062213 | A1 | 3/2017 | Patolsky |
| 2017/0110332 | A1 | 4/2017 | Beveridge |
| 2017/0125574 | A1 | 5/2017 | Chowdhury et al. |
| 2017/0178971 | A1 | 6/2017 | Merckling et al. |
| 2017/0200820 | A1 | 7/2017 | Conway et al. |
| 2017/0229569 | A1 | 8/2017 | Chowdhury et al. |
| 2017/0257025 | A1 | 9/2017 | Meiser |
| 2017/0309736 | A1 | 10/2017 | Huang et al. |
| 2017/0323788 | A1 | 11/2017 | Mi |
| 2017/0338277 | A1 | 11/2017 | Banna et al. |
| 2018/0033889 | A1 | 2/2018 | Yang et al. |
| 2018/0229618 | A1 | 8/2018 | Lee et al. |
| 2018/0240797 | A1 | 8/2018 | Yokoyama et al. |
| 2018/0316383 | A1 | 11/2018 | Kamgaing et al. |
| 2019/0013404 | A1 | 1/2019 | Carlson et al. |
| 2019/0081164 | A1 | 3/2019 | Shrivastava |
| 2019/0149031 | A1 | 5/2019 | Kitamoto |
| 2019/0165182 | A1 | 5/2019 | Van Dal |
| 2019/0189746 | A1 | 6/2019 | Makiyama et al. |
| 2019/0229149 | A1 | 7/2019 | Yoo |
| 2019/0252377 | A1 | 8/2019 | Clarke et al. |
| 2019/0284706 | A1 | 9/2019 | Takeda et al. |
| 2019/0356278 | A1 | 11/2019 | Smith |
| 2019/0393104 | A1 | 12/2019 | Ando |
| 2020/0027972 | A1 | 1/2020 | Petta et al. |
| 2020/0127173 | A1 | 4/2020 | Park et al. |
| 2020/0161531 | A1 | 5/2020 | Olivadese et al. |
| 2020/0185219 | A1 | 6/2020 | Busani et al. |
| 2020/0185386 | A1 | 6/2020 | Yamazaki et al. |
| 2020/0194416 | A1 | 6/2020 | Or-Bach et al. |
| 2020/0203556 | A1 | 6/2020 | Feuillet et al. |
| 2020/0256710 | A1 | 8/2020 | Rule et al. |
| 2020/0381538 | A1 | 12/2020 | Shih et al. |
| 2021/0057601 | A1 | 2/2021 | Oliver et al. |
| 2021/0265632 | A1 | 8/2021 | Olsson |
| 2021/0288539 | A1* | 9/2021 | Abdel-Khalik ......... H02K 3/28 |
| 2021/0327712 | A1 | 10/2021 | Olsson |
| 2022/0231298 | A1 | 7/2022 | Olsson |
| 2022/0302293 | A1 | 9/2022 | Olsson |
| 2022/0393656 | A1 | 12/2022 | Olsson |
| 2022/0396886 | A1 | 12/2022 | Olsson |
| 2022/0399826 | A1 | 12/2022 | Olsson |
| 2022/0416025 | A1 | 12/2022 | Olsson |

(56) References Cited

U.S. PATENT DOCUMENTS

| | | |
|---|---|---|
| 2023/0119801 A1 | 4/2023 | Olsson |
| 2023/0261621 A1 | 8/2023 | Olsson |
| 2023/0327009 A1 | 10/2023 | Olsson |
| 2023/0352575 A1 | 11/2023 | Olsson |
| 2024/0186365 A1 | 6/2024 | Olsson |
| 2024/0235412 A1 | 7/2024 | Olsson |
| 2024/0250686 A1 | 7/2024 | Olsson |
| 2024/0332423 A1 | 10/2024 | Olsson |
| 2024/0356456 A1 | 10/2024 | Olsson |
| 2024/0363693 A1 | 10/2024 | Olsson |
| 2024/0380369 A1 | 11/2024 | Olsson |
| 2025/0040175 A1 | 1/2025 | Olsson |
| 2025/0063732 A1 | 2/2025 | Olsson |
| 2025/0081501 A1 | 3/2025 | Olsson |

FOREIGN PATENT DOCUMENTS

| | | |
|---|---|---|
| CN | 101765934 | 3/2013 |
| CN | 103477418 | 12/2013 |
| CN | 105659383 | 6/2016 |
| CN | 105914232 | 8/2016 |
| CN | 105990443 | 10/2016 |
| CN | 106549050 | 3/2017 |
| CN | 110324568 | 10/2019 |
| CN | 110336028 | 3/2021 |
| CN | 112490243 | 3/2021 |
| EP | 1959530 | 8/2008 |
| EP | 2075745 | 7/2009 |
| EP | 2571065 | 3/2013 |
| EP | 2816729 | 12/2014 |
| EP | 284700 | 1/2015 |
| EP | 2838125 | 2/2015 |
| EP | 2955763 | 12/2015 |
| GB | 2520687 | 6/2015 |
| JP | H09246471 | 9/1997 |
| JP | 2000101152 | 4/2000 |
| JP | 2003101069 | 4/2003 |
| JP | 2005268555 | 9/2005 |
| JP | 2008057383 | 3/2008 |
| JP | 2009152189 | 7/2009 |
| JP | 2010232423 | 10/2010 |
| JP | 2011529639 | 12/2011 |
| JP | 2012018919 | 1/2012 |
| JP | 2014146744 | 8/2014 |
| JP | 2014217252 | 11/2014 |
| JP | 2015198549 | 11/2015 |
| JP | 2016135000 | 7/2016 |
| JP | 2018050419 | 3/2018 |
| JP | 2019092292 | 6/2019 |
| JP | 2019114581 | 7/2019 |
| JP | 2020061510 | 4/2020 |
| KR | 10-2013-0030193 | 3/2013 |
| TW | 201036347 | 10/2010 |
| WO | WO 95/08452 | 3/1995 |
| WO | WO 2010/01412 | 1/2010 |
| WO | WO 2010/100599 | 9/2010 |
| WO | WO 2012/077513 | 6/2012 |
| WO | WO 2012/105901 | 8/2012 |
| WO | WO 2013/049817 | 4/2013 |
| WO | WO 2017/038403 | 3/2017 |
| WO | WO 2017/111844 | 6/2017 |
| WO | WO 2017/213644 | 12/2017 |
| WO | WO 2019/144966 | 8/2019 |
| WO | WO 2019/202258 | 10/2019 |
| WO | WO 2020/222149 | 11/2020 |
| WO | WO 2021/021415 | 2/2021 |

OTHER PUBLICATIONS

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.

Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.

Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.

Anonymous, "Phase-shift oscillator Wikipedia" Apr. 7, 2019 (Apr. 7, 2019), XP055733459, Retrieved from the Internet: URL:https://en.wikipedia.org/w/index.php?title=Phase-shift-oscillator&oldid=89138949 5, retrieved on Sep. 23, 2020 in 3 pages.

Cai et al, Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.

Chebrolu et al., "Recent progress in quantum dot sensitized solar cells: an inclusive review of photoanode, sensitizer, electrolyte, and the counter electrode", Journal of Materials Chemistry C 2019, pp. 4911-4933.

Dahal et al., "Realizing InGaN monolithic solar-photoelectrochemical cells for artificial photosynthesis", Appl. Phys, Lett. 104, 143901, (2014); Published Onlines: Apr. 9, 2014.

Enthaler et al, "Carbon dioxide and formic acid-the couple for environmental-friendly hydrogen storage?", Energy & Enviormental Science, 2010 pp. 1207-1217.

Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.

Fujii et al., "Photoelectrochemical Properties of Ingan For H2 Generation From Aqueous Water", Japanese Journal of Applied Physics, Japan Society Of Applied Physics, JP, vol. 44, No. 10, Oct. 11, 2005 (Oct. 11, 2005), pp. 7473-7435.

Mukhopadhyay, P. "Comparative DC Characteristic Analysis of AlGaN/GaN HEMTs Grown on Si(111) And Sapphire Substrates by MBE" Jour. Of Elec. Mat. vol. 43, No. 4, Feb. 14, 2014 pp. 1263-1270 (Year: 2014).

Nainani, "High-Performance III-V Pmosfet", May 2011, in 131 pages.

Ramakrishna et al. "Nitrogen doped CNTs supported Palladium electrocatalyst for hydrogen evolution reaction in PEM water electrolyser", International Journal of Hydrogen Energy, 2016 pp. 20447-20454.

Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).

Sritoma et al., IIA Novel GaN-Hemt based Inverter and Cascade Amplifier 11 , 2018 IEEE Electron Devices Kolkata Conference (EDKCON), IEEE, Nov. 24, 2018 (Nov. 24, 2018), pp. 465-469.

Sundaram et al, "Single-crystal nanopyramidal BGaN by nanoselective area growth on AlN/Si(111) and GaN templates"., Nanotechnology, vol. 27 (2016) 7 pages.

Tavares et al., "Implementation of a high frequency PWM signal in FPGA for GaN power devices switching", 2017 Brazilian Power Electronics Conference (COBEP), IEEE, Nov. 19, 2017 (Nov. 19, 2017), pp. 1-7.

Wang et al, Germanium-Assisted Direct Growth of Graphene on Arbitrart Dielectric Substrates for Heating Device, Nano Micro Small, vol. 13, No. 28 Jul. 26, 2017.

Doring et al., "Technology of GaN-Based Large Area CAVETs With Co-Integrated HEMTs," IEEE Transactions on Electron Devices, vol. 68, No. 11, Nov. 2021, pp. 5547-5552.

Eickhoff et al., "Piezoresistivity of Alx Ga1-xN layers and Alx Ga10xN/GaN heterostructures," Journal of Applied Physics, American Institute of Physics, vol. 90, No. 7, Oct. 1, 2001, pp. 3383-3386.

Gust et al., "Solar Fukes via Artificial Photosynthesis", Department of Chemistry and Biochemestry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

(56) References Cited

OTHER PUBLICATIONS

Jones et al., "Review of Commercial GaN Power Devices and GaN-Based Converter Design Challenges," IEEE, vol. 4, No. 3, Sep. 2016, pp. 707-719.

Kampl et al., "2500 W full-bridge totem-pole power factor correction using CoolGaN," Nov. 5, 2018, pp. 1-46.

Kozodoy et al. "Polarization-enhanced Mg doping of AlGaN/GaN superlattices," Applied Physics Letters, vol. 75, No. 16, Oct. 18, 1999, pp. 2444-2446.

Kumar et al. "Quantum dot activated indium gallium nitride on silicon as photoanode for solar hydrogen generation", Communcations Chemestry, in 7 pages.

Lan et al., "Efficienty improvement of the Light-emitting diodes by the lateral overgrowth GaN on an AlN nanorod template," 14th International Conference on Solid State Lighting and LED-based Illumination Systems 957100 SPIE, Sep. 8, 205 in 7 pages.

Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 2013), pp. 526-529.

Lu et al., "Paralleling GaN E-HEMTs in 10KW-100KW systems," 2017 IEEE Applied Power Electronics Conference and Exposition, Mar. 26, 2017, pp. 3049-3056.

Naveed ul Hassan Alvi et al., "InN/InGaN Quantum Dot Photoelectrode: Efficient Hydrogen Generation By Water Splitting At Zero Voltage", Nano Energy, vol. 13, Mar. 6, 2015 (Mar. 6, 2015), pp. 291-297.

Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).

Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.

Seo et al., "i-based nonalloyed Ohmic contacts for Al0.15Ga0.85N/GaN high electron mobility transistors using regrown n+-GaN by plasma assisted molecular beam epitaxy," Applied Physics Letters, vol. 93, Issue 10, Sep. 8, 2008, pp. 102102-102102.

Tripathy et al., "AlGaN/GaN two-dimensional-electron gas heterostructures on 200 mm diameterSi(111)", Applied Physics Letters, 101, 082110 (2012) https://doi.org/10.1063/1.4746751 Submitted: Feb. 7, 2012 , Accepted: Aug. 1, 2012 , Published Online: Aug. 23, 2012.

\* cited by examiner

INDUCTION MACHINE

TECHNICAL FIELD

The present invention relates induction machines and circuitry for driving such machines.

BACKGROUND

An induction machine, also known as an asynchronous machine, is a commonly used alternating current, AC, electric machine. An induction machine may be used both as a motor and a generator. The most common use of an induction machine is as an induction motor. An induction machine may be arranged as a single-phase machine or a polyphase machine. Induction machines generally comprise a stationary stator portion and a free to rotate, rotor portion.

In an induction machine, electric currents are induced in the rotor from the alternating magnetic fields of the stator windings. In turn, the induced currents produce counteracting magnetic fields and creates torque, causing the rotor to rotate. The rotor of an induction machine may be a squirrel cage rotor or a wound type rotor relative to the stator.

Induction machines are used in electrically propelled vehicles such as trains and road vehicles. Induction machines may also be used for electrically propelled aircraft, in particular fixed-wing and rotary-wing aircraft.

A major issue for electric aviation is that induction machines cannot yet replace chemically fueled aircraft engines. Besides the need for improved batteries, a major problem with electric induction machines is that they generally have a too low power-to-weight ratio to be practically viable for aircraft propulsion.

Single-phase induction machines are particularly hampered in this respect by them requiring large capacitors for large power outputs and winding ratios. Pushing induction machines to higher power outputs may thus reduce their power-to-weight ratio. There is thus need for improvements within the technical field.

SUMMARY OF THE INVENTION

An object of the present invention is to at least mitigate some of the above issues.

According to a first aspect there is provided an induction machine comprising a rotor, a stator, and a phase-shift oscillator. The stator comprises a first winding and a second winding. The second winding is arranged at a first angle relative to said first winding. The phase-shift oscillator comprises a transistor, and a phase-shift network. The first winding is connected to a first node of the phase-shift network. The second winding is connected to a second node of the phase-shift network. The phase-shift oscillator is configured to provide a first phase electric signal at the first node and a second phase electric signal at the second node. A difference between the first and second phase corresponds to the first angle.

The first winding and the second winding may alternatively be referred to as a main winding and an auxiliary winding, respectively. The phase-shift oscillator may be understood as circuitry, comprising at least one transistor, that shifts the phase of an alternating current between different nodes of the phase-shift oscillator circuitry. In particular, the phase-shift is realized between different nodes of the phase-shift network, being part of the phase-shift oscillator. The phase-shift network may be a resistor-capacitor, RC, based phase-shift network. The phase-shift network may alternatively be understood as a feedback network of the phase-shift oscillator. The transistor may e.g. be a metal-oxide-semiconductor field-effect transistor, MOSFET or a bipolar junction transistor, BJT. The term transistor may be understood as referring to a transistor circuitry or an amplifier portion of the phase-shift oscillator. Such transistor circuitry may further comprise e.g. required drive and/or biasing circuitry.

The phase-shift oscillator may be an inverter or an inverter network, e.g. an inverter or an inverter network configured for at least 6 phases. The inverter or inverter network may comprise the previously mentioned transistor. The inverter or inverter network may comprise the previously mentioned phase-shift network. Alternatively, the first winding may be connected to a first node of the inverter network and the second winding may be connected to a second node of the inverter, wherein the inverter network is configured to provide a first phase electric signal at the first node and a second phase electric signal at the second node, wherein a difference between the first and second phase corresponds to the first angle.

During operation of the induction machine, the rotor rotates relative to the stator. The rotor may be understood as placed concentrically and inside the stator. The induction machine may operate by induction. When fed an alternating current, the windings, arranged at a specific relative angle apart from the other, produce alternating magnetic fields. These fields may induce currents in the rotor, which will in turn produce its own magnetic fields. The interaction between the magnetic fields of the rotor and the windings of the stator are what produce the rotation of the rotor. However, the alternating magnetic field may need to be converted or modulated to form a rotating magnetic field, RMF, in order to provide a more practical, self-starting induction machine. Conventionally, for single phase AC induction machines, an RMF is formed by connecting a capacitor in series with one of the stator windings.

The inventor has realized that a phase-shift oscillator may be utilized to achieve the required phase-shift between currents being fed to the first winding and the second winding. As such the induction machine may produce a RMF without the need for, or at least being less reliant on, a conventional capacitor connected in series with one of the windings, e.g. the second winding, in order for the induction machine may be self-starting when operating as a motor, i.e. when converting electrical energy to rotational/mechanical energy. Generally, higher power induction machine operation and larger winding ratios require the series capacitor to have a higher capacitance which in turn leads to the capacitor becoming physically larger i.e. weighing more and becoming bulkier. Thus, by not needing, or at least relying less on, a series capacitor, the power-to-weight ratio of the induction machine may be improved.

In turn, this enables smaller and more compact electric motors with higher power-to-weight ratio by the active RC phase-shift oscillator phase-shift. For the induction motor the rotational speed of the rotor may be controlled by an AC voltage, that either weakens or strengthens the magnetic fields generated by the windings causing the motor to run faster. The power may be calculated as the rotational speed times the torque. Further windings and phases may be beneficial for creating more torque for the same electrical power cost.

An active RC phase-shift oscillator, i.e. comprising a transistor, may be more beneficial for an induction machine than a passive RC phase-shift oscillator would be. With a passive phase-shift oscillator it may be difficult to achieve a phase-shift of 90 degrees, while it may provide a 45 degree or 60-degree phase-shift at certain frequencies. The phase-shift for a 6-phase induction machine according to the invention may be made with 30-degree phase shifts. Cascade connecting passive filters together to produce larger-order filters may be difficult to implement accurately. This is because the dynamic impedance of each RC-filter order affects its neighboring RC network. In addition, temperature for example may influence the phase-shift and the component tolerances may create deviations in practice. Active phase-shifting with the use of transistors may be beneficial as the circuit may comprise smaller-value resistors and capacitors i.e. not large and bulky high inductance inductors that would increase both the weight and form factor of the motor.

The first angle may be 60 degrees. Such a phase-shift is easily realized by RC-based phase-shift networks and phase-shift oscillators.

The stator may further comprise a third winding, arranged at a second angle relative to said first winding. The third winding may be connected to a third node of the phase-shift network. The phase-shift oscillator may be configured to provide a third phase electric signal at the third node. A difference between the first and third phase may correspond to the second angle.

The term electric signal may refer to various types of electric signals e.g. a voltage, or a current. By utilizing a third node of the phase-shift network and a corresponding third stator winding several advantages may be realized. E.g. such a third winding may promote a more evenly radial distribution of windings which may in turn be advantageous for reducing the winding ratio or increasing the rotational speed, the torque, and/or the output power of the induction machine. This may be understood as enabling the use of a 3-phase stator, with all of its inherent benefits, for a single-phase AC input electric signal.

The second angle may be 120 degrees. Such a phase-shift is also easily realized by RC-based phase-shift networks and phase-shift oscillators.

The first winding may be a dual pole winding. The second winding may be a dual pole winding. This may be understood as the windings looping back across the other side of the stator, i.e. 180 degrees from the initial portion of the winding. Two different magnetic fields, oriented 180 degrees apart, may be produced by the current flowing in different directions, relative to the rotor, through the initial and the back-looping portions of one of the windings.

As such, further utility for each phase electric signal may be found. By using dual pole windings, the formation of the RMF is radially distributed more evenly in the stator. Additionally, the third winding may also be a dual pole winding.

The transistor may be a power transistor. A power transistor may be understood as a transistor configured to operate under high currents and voltages. In general, higher current may lead to a more powerful RMF being produced. In turn, this may lead to increasing induction machine rotational/mechanical output power. The power transistor may be configured for a threshold voltage of at least 1200 V. A power transistor configured for a threshold voltage of 1200 V may be configured to start conducting at a gate voltage, e.g. a gate to source voltage, of 1200 V.

The transistor may be a high-electron-mobility transistor, HEMT. This should be understood as the transistor comprising at least two different band gap semiconductor structures forming heterostructure and a common interface between the at least two semiconductor structures. Such a transistor may alternatively be referred to as a heterostructure field-effect transistor, HFET. The transistor should also be understood as comprising a source, a drain, and a gate contact. HEMTs may provide several advantages such as higher power operation and higher frequency switching.

Higher transistor frequency switching, regardless how it is achieved, may be advantageous as it may improve the oscillation stability of the phase-shift oscillator at high frequencies. The oscillation may thus be less saturated and the output, i.e. the electric signals at the nodes, will be less distorted. By higher frequency switching the need for additional circuitry for stabilizing the electric signals may be reduced or removed completely. When using a transistor such as a HEMT the output may be less noisy (electric signal wise) than when using a BJT or a MOSFET The transistor may comprise GaN. GaN may refer to the compound semiconductor gallium nitride. The transistor, or structures thereof, may substantially consist of or at least comprise some GaN. GaN provides several advantages to transistors comprising it. These may include higher power operation and higher frequency switching. A transistor comprising GaN may be a GaN-based HEMT.

Active phase-shift may provide good frequency stability and an output sinusoidal electric signal (onto the windings) that is low-noise and perhaps even distortion free if the transistor is a low-noise amplifier such as an amplifier based on a GaN-based HEMT. GaN-based HEMTs may achieve high gain and low-noise. This may be suitable for high voltage applications e.g. 220V for a ~250 kW AC induction machine. The frequency range may be a few Hz to several hundred of kHz. The frequency may be suitable for regulating the speed of the induction machine.

The first winding and the second winding may be configured to produce a magnetic field upon transmission of an electric current.

The induction machine may further comprise a current rectifier, wherein the current rectifier is configured for regenerative charging. The current rectifier may be understood as current rectification circuitry. As such, the induction machine may also operate as a generator, e.g. for re-charging battery, in addition to just operating as a motor.

The induction machine according to anyone of claims may further comprise a drive circuitry for driving the transistor of the phase-shift oscillator. Alternatively, the induction machine may comprise a drive circuitry for driving the transistor of the inverter or inverter network.

The first winding and/or the second winding may comprise a superconductor.

As such, higher currents and thus also larger magnetic fields may be produced with less energy losses.

The superconductor may comprise $V_3Ga$, $Ga_{1-2x}Cu_xAs_xN$, or NbN.

The induction machine may be configured to receive an alternating current input. The input to be received may be understood as a single-phase AC input.

The phase-shift oscillator may be configured to provide a 6-phase electric signal. The 6-phase electric signal herein refers to a plurality of electric signals comprising six phases. The first phase electric signal and the second phase electric signal may be comprised in the 6-phase electric signal. Thus, the phase-shift oscillator may be configured to provide a first phase electric signal, a second phase electric signal, a third phase electric signal, a fourth phase electric signal, a fifth phase electric signal, and a sixth phase electric signal. The respective electric signals of the 6-phase electric signal may be provided at respective nodes of the phase-shift network, i.e. at a first node, a second node, a third node, a fourth node, a fifth node and a sixth node.

The induction machine may comprise six windings, wherein each of the six windings is configured to receive a respective signal of the 6-phase electric signal. The six windings may be dual pole windings. The six windings may be arranged around the stator with an angle separating consecutive windings. The phase difference between consecutive electric signals of the 6-phase electric signal may correspond to the angle separating the corresponding windings.

It should be understood that the phase-shift oscillator may be configured to provide at least a 6-phase electric signal. Thus, more phases than 6 may be provided. Each phase may be provided to a respective winding.

The induction machine may be configured to receive a 3-phase input electric signal. The 3-phase input electric signal may be seen as an alternating current input with 3 phases. The induction machine may be configured to convert the 3-phase input electric signal into the 6-phase electric signal. The induction machine may be configured to convert the 3-phase input electric signal into an electric signal having a number of phases, the number of phases being a multiple of 3.

According to a second aspect there is provided an electric aircraft propulsion system. The electric aircraft propulsion system comprises an induction machine according to the first aspect. The electric aircraft propulsion system further comprises an axle, physically connected to and concentrically aligned with the rotor. The electric aircraft propulsion system further comprises an electrical battery, electrically connected to the induction machine. The electric aircraft propulsion system further comprises control circuitry, electrically connected to the induction machine, wherein the control circuitry is configured to control the induction machine.

Due to the improved power-to-weight ratio of the induction machine, a propulsion system for electric aircraft may provide numerous advantages when based on such an induction machine. The improved power-to-weight may be carried over to the aircraft propulsion system. This may enable a lighter aircraft propulsion system and in turn a lighter aircraft overall. This may be advantageous for improving battery longevity and range of the electric aircraft.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or acts of the methods described as such device and method may vary. It is also to be understood that the terminology used herein is for purpose of describing particular embodiments only, and is not intended to be limiting.

It must be noted that, as used in the specification and the appended claims, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects of the present invention will, in the following, be described in more detail with reference to appended figures. The figures should not be considered limiting; instead they should be considered for explaining and understanding purposes.

As illustrated in the figures, the sizes of layers and regions may be exaggerated for illustrative purposes and, thus, are provided to illustrate the general structures. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

To clarify, the term horizontal, as well as similar terms, may refer to the horizontal direction in the figures, when the sheet is portrait oriented. The term radial, as well as similar terms, may refer to features and directions relating to a radius of circular or cylindrical features in the figures.

Figure 1:
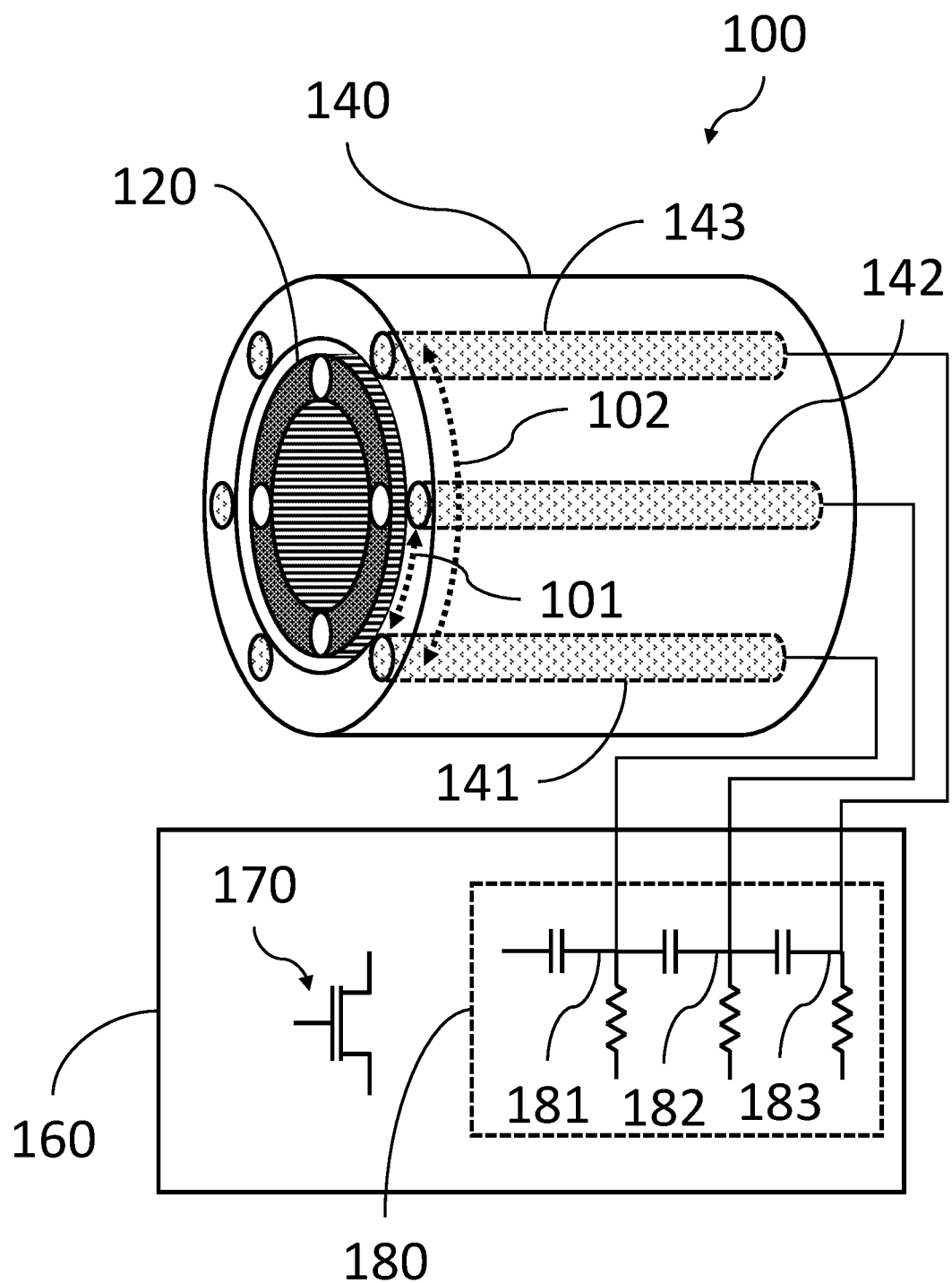
FIG. 1 shows a schematic illustration of an induction machine.

FIG. 1 shows an induction machine 100. The induction machine 100 is shown to comprise a rotor 120 and a stator 140. The rotor 120 and the stator are both illustrated as cylindrical shapes. The rotor 120 is shown as being concentrically arranged within the stator 140.

The rotor 120 may comprise conducting material, e.g. metal. The rotor 120 may comprise one of copper, aluminum, and/or iron.

The rotor 120 may be a wound type rotor or a squirrel cage rotor. The rotor 120 may comprise a plurality of horizontally elongated conducting bars, along the length of the rotor 120 cylinder. These may be configured to have currents being induced on them when they are placed within an alternating or rotating magnetic field. The rotor 120 may comprise a plurality of lamination layers, stacked along the length of the cylinder, to reduce the effects of eddy currents forming. The laminations layers may comprise steel.

The stator 140 comprises a first winding 141 and a second winding 142. The stator 140 may comprise a third winding 143. The windings 141, 142, 143 may be evenly or arbitrarily radially distributed around the stator. The windings 141, 142, 143 are shown as the cylinders, elongated along the length of the larger stator 140 cylinder in FIG. 1.

The second winding 142 is arranged at a first angle 101 relative to the first winding 141. The third winding 143 may be arranged at a second angle 102 relative to the first winding 141. The third winding 143 may further be arranged at the first angle 101 from the second winding 142. The first angle 101 may be 60 degrees. The second angle 102 may be 120 degrees.

The windings 141, 142, 143 may be dual pole windings. By this, the windings 141, 142, 143 may loop back on the other side of the stator 140, i.e. 180 degrees from the initial part of the windings 141, 142, 143. FIG. 1 shows a dual pole winding setup with three main windings 141, 142, 143 with their corresponding and antipodally or diametrically oppositely arranged windings. Counting the main and the antipodal windings FIG. 1 shows a total of 6 windings, arranged 30 degrees apart. The main windings 141, 142, 143 and their corresponding antipodal windings may be directly connected, allowing current to flow through them as a single conductor. The main windings 141, 142, 143 and their corresponding antipodal windings may be arranged such that when conducting a same current, the current will flow in opposite directions in the antipodal windings relative to the direction of the same current through the corresponding main windings 141, 142, 143. As such, at any one time each main winding 141, 142, 143 and the corresponding antipodal windings will give rise to relatively opposite magnetic fields.

The windings may be located in hollowed out horizontal slots in the stator 140. The first winding 141, the second winding 142, and the third winding 143 may be configured to produce a magnetic field around respective winding 141, 142, 143 upon transmission of an electric current.

The windings 141, 142, 143 may comprise conducting material, e.g. metal. The windings 141, 142, 143 may e.g. comprise copper or aluminum.

Any one of the windings 141, 142, 143 may comprise a superconductor. The superconductor may comprise $V_3Ga$, $Ga_{1-2x}Cu_xAs_xN$, or NbN.

The stator 140 may also comprise a plurality of lamination layers, stacked along the length of the stator 140 cylinder, to reduce the effects of eddy currents forming. The laminations layers may comprise steel.

The induction machine 100 further comprises a phase-shift oscillator 160. The phase-shift oscillator 160 comprises a transistor 170. The phase-shift oscillator 160 further comprises a phase-shift network 180.

The phase-shift network 180 comprises a first node 181 and a second node 182. The phase-shift network may further comprise a third node 183.

The phase-shift network 180 is shown to be a RC-network in FIG. 1. The phase-shift network 180 may comprise three capacitors connected to three resistors. The nodes 181, 182, 183 may be formed between each capacitor/resistor pair. In such a phase-shift network the phase is shifted 60 degrees for each capacitor/resistor pair. The phase difference between node 181 and node 182 may be 60 degrees. The phase difference between node 181 and node 183 may be 120 degrees or 60+60 degrees.

Figure 2:
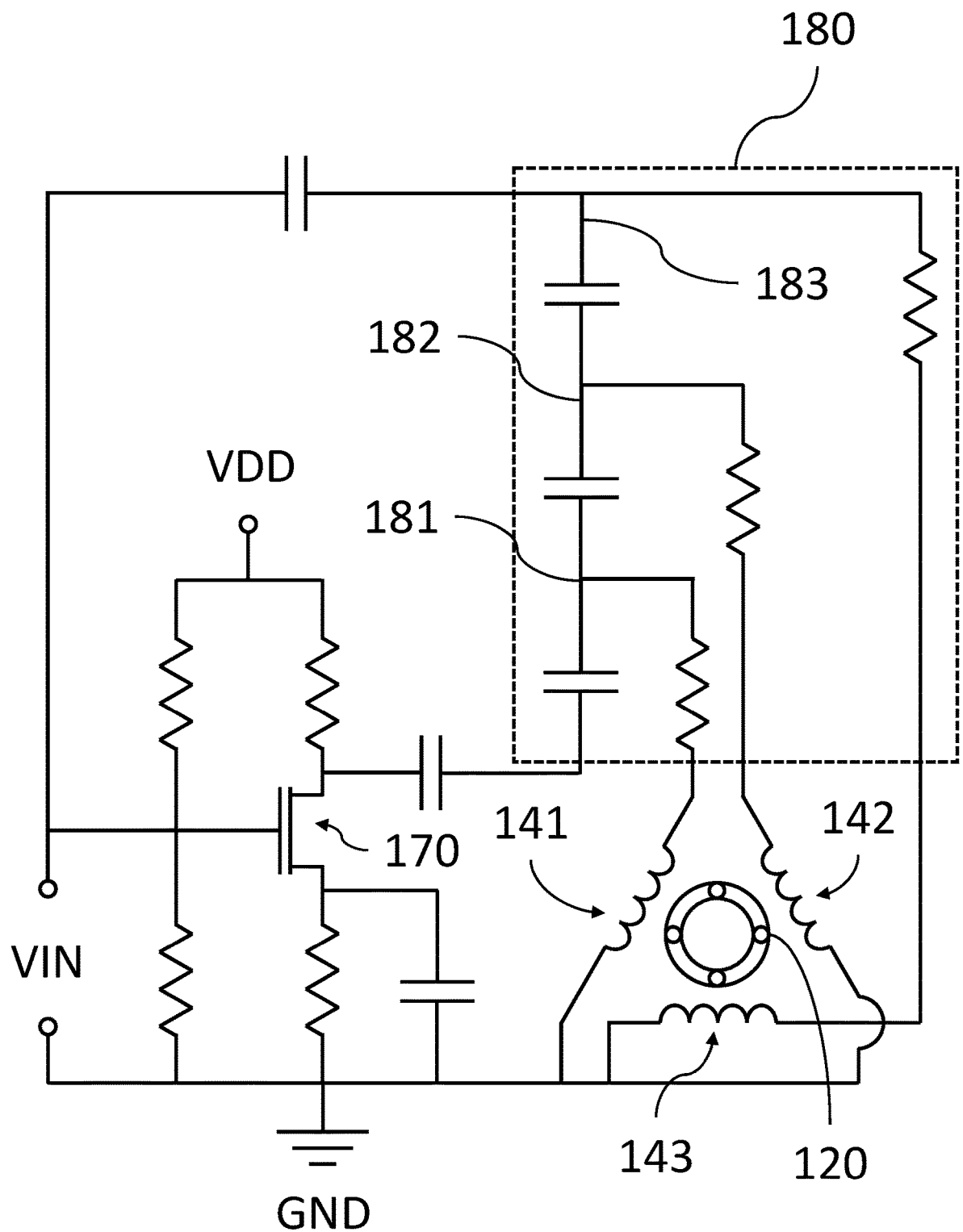
FIG. 2 shows a circuit diagram of a 3-phase induction machine based on 1-phase AC input electric signal.

The induction machine 100 may further comprise drive circuitry for driving the transistor 170 of the phase-shift oscillator 160, as shown in FIG. 2. The portion of the circuit containing the transistor 170 and the biasing/drive circuitry may be referred to as the amplifier portion. The amplifier portion may shift the phase of the output connected to the phase-shift network 180 by 180 degrees from the phase of the electric signal input over the VIN terminals. The induction machine may be configured to receive an AC input e.g. over the VIN terminals.

The phase-shift oscillators may operate by adding the phase-shift associated with the amplifier portion with the phase-shift of the phase-shift network 180 to complete a full 360-degree phase-shift, i.e. 180+60+60+60=360 degrees.

The biasing/drive circuitry may comprise two resistors acting as a voltage divider for the gate of the transistor 170. A resistor connected between the drain of the transistor and a power supply rail, VDD in order to limit the drain current. Another resistor connected between the source of the transistor 170 and ground, GND, may be used to improve circuit thermal stability. A capacitor may be connected as a by-pass capacitor between the source of the transistor 170 and GND.

The first node 181 is connected to the first winding 141. The second node 182 is connected to the second winding 142. The third node 183 may be connected to the third winding 143. The nodes 181, 182, 183 may be directly connected to respective winding 141, 142, 143, as is illustrated in FIG. 1. The nodes 181, 182, 183 may alternatively be indirectly connected to respective winding 141, 142, 143, i.e. via a resistor as is shown in FIG. 2.

The phase-shift oscillator 160 is configured to provide a first phase electric signal at the first node 181 and a second phase electric signal at the second node 182. A difference between the first and second phase corresponds to the first angle 101. The phase-shift oscillator 160 may be configured to provide a third phase electric signal at the third node 183. A difference between the first and third phase corresponds to the second angle 102.

The transistor 170 may be a MOSFET or a BJT. The transistor 170 may comprise Si, SiC, or Ge. The transistor 170 may be a power transistor.

The transistor 170 may be a HEMT. The transistor 170 may comprise GaN. The transistor 170 may comprise AlGaN. The transistor 170 may be a GaN/AlGaN HEMT.

The induction machine 100 may further comprise a current rectifier. The current rectifier may be configured for regenerative charging. The current rectifier may be used for charging of a re-chargeable battery.

Figure 3:
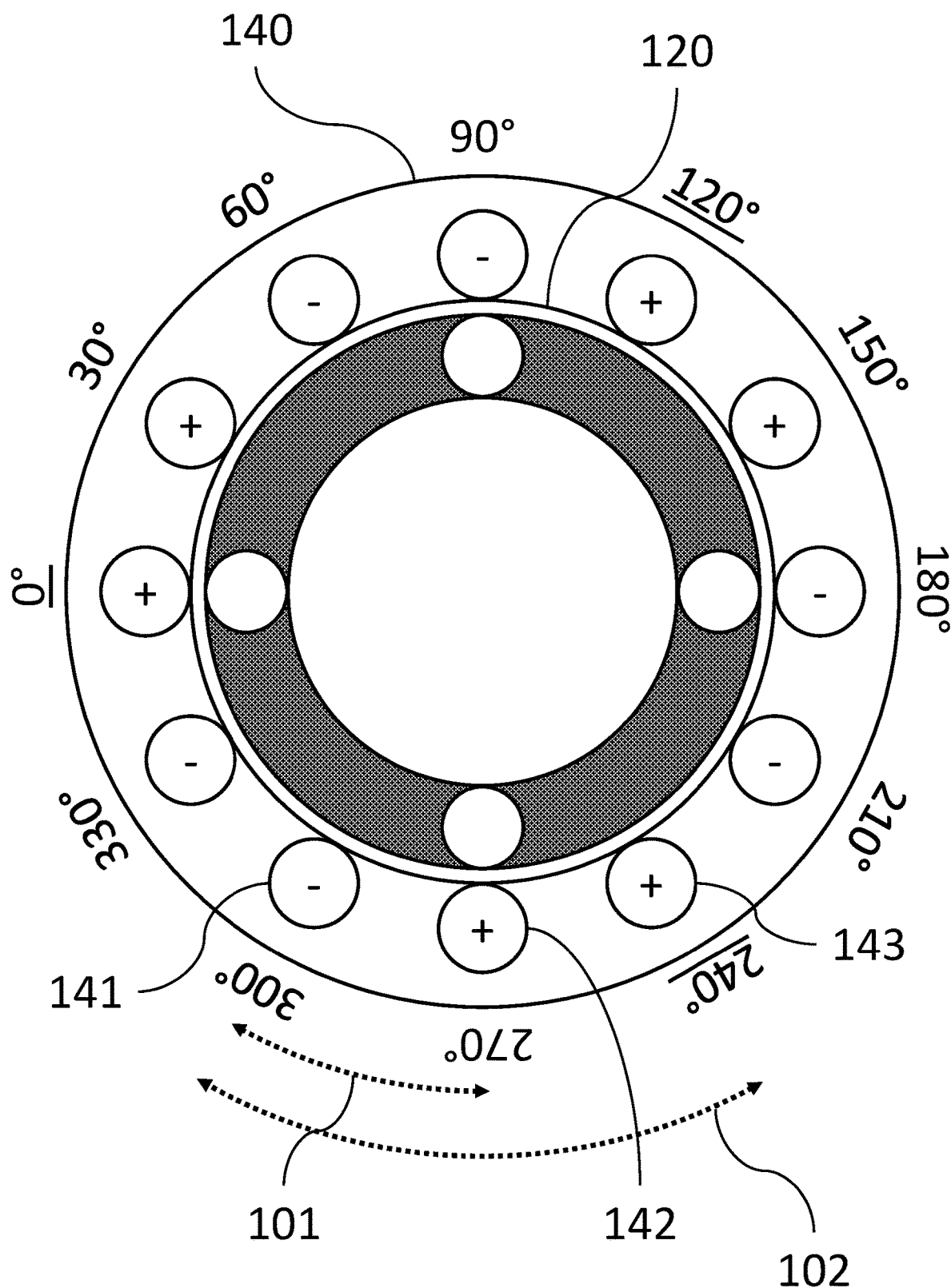
FIG. 3 shows a cross section view of a stator-rotor setup comprising more further windings.

As shown in FIG. 3, the induction machine may feature a rotor 120 and stator 140 setup comprising further windings 141, 142, 143 than in the example of FIG. 1. In the example of FIG. 3 a total of 12 windings are shown, arranged 30 degrees apart. Such a setup may be arranged to receive a 6-phase electric signal input on the windings 141, 142, 143. The example may further feature corresponding antipodal windings as with the case of FIG. 1.

A 6-phase induction machine with a rotor-stator setup as seen in FIG. 3 may be based on 3 original phases at 0° (+), 120° (+), and 240° (+) with the polarity indicated in parenthesis. Each of these phases have an opposite and antipodal pole winding at 180° (−), 300° (−) and 60° (−). Further poles are introduced at 30° (+) and 210° (−); 30° (+) and 270° (+) and 90° (−); and 330° (+) and 150° (−) i.e. with 30-degree phase-shifts from the original electrical signal phases at 0° (+), 120° (+), and 240° (+).

In this sense, only the positive polarity is counted for the phases. Hence, the clock-wise polarities and angles may be 0° (+), 30° (+), 60° (+), 90° (−), 120° (+), 150° (−), 180° (−), 210° (−), 240° (+), 270° (+), 300° (−), 330° (−) or in pairs as 0° (+) and 180° (−); 30° (+) and 210° (−), 60° (−) and 240° (+), 90° (−) and 270° (+), 120° (+) and 300° (−), 150° (−), and 330° (−).

Figure 4:
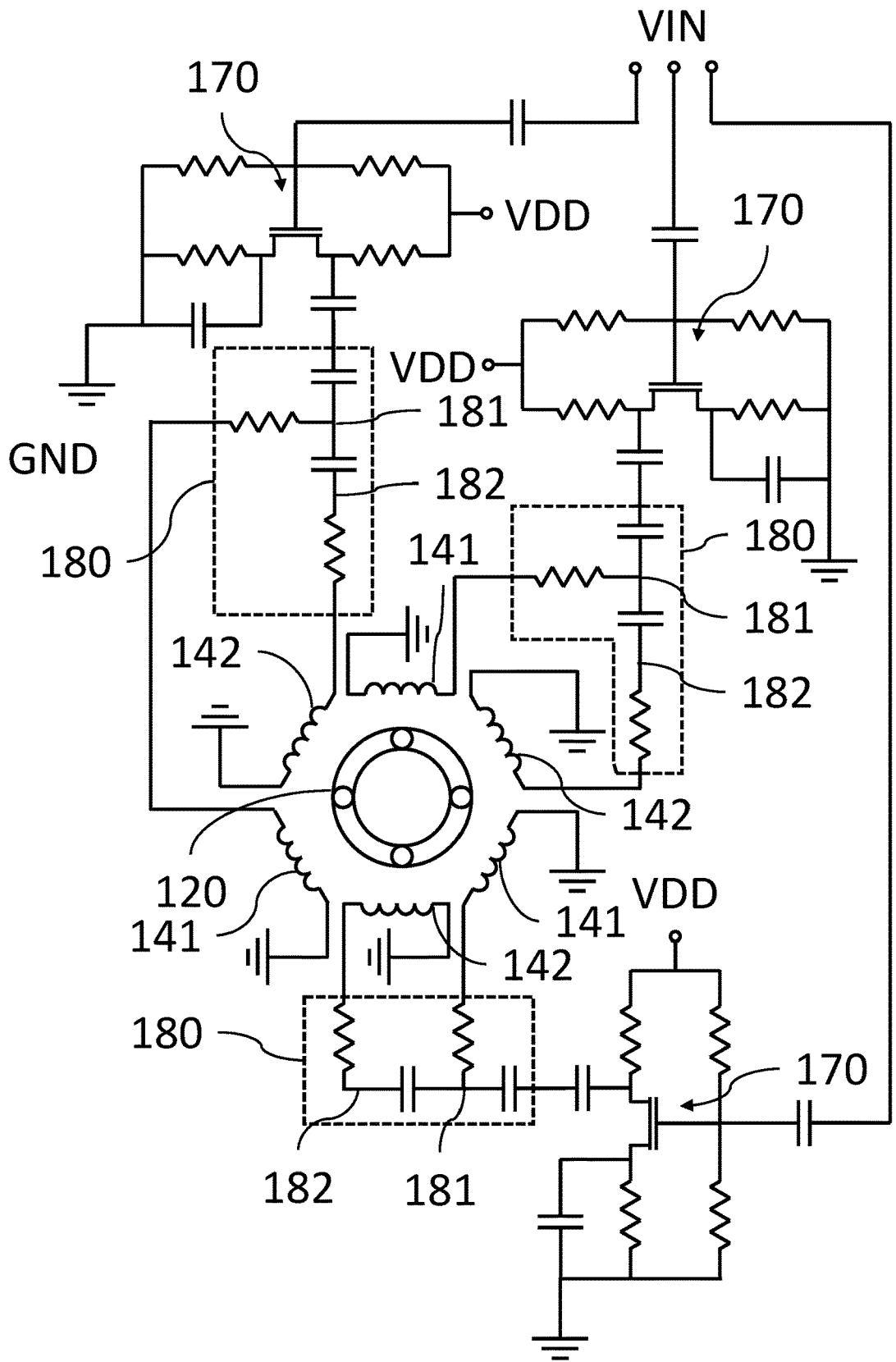
FIG. 4 shows a circuit diagram of a 6-phase induction machine based on a 3-phase AC input electric signal.

Such a 6-phase induction machine, as has been described, may be provided by electric signal inputs by a circuit setup such as the one shown in FIG. 4. Essentially the input electric signal may be a 3-phase electric signal, VIN, of which the 3 comprised phase signals may be shifted into additional phases through different phase-shift oscillators comprising separate phase-shift networks 180. The 3 original phases, as occurring on the three different nodes of VIN, may be 0, 120, and 240 degrees. The nodes 181, 182 of the phase shift networks 180 are shown to provide different phase electric signals to the first windings 141 and the second windings 142. The difference in phase between the first and second nodes 181, 182 may be 30 degrees. The circuit of FIG. 4 is shown to comprise 3 transistors 170. Each transistor is shown in connection with a respective phase shift network 180 and a respective input line for receiving one of the 3 input phase electric signals VIN.

Additionally, the induction machine 100 may be realized as a 2-phase induction machine. The 2-phase induction machine may only require one additional phase. Such an additional phase may be obtained by using a high-pass filter or a low-pass filter. A −3 dB filter may create a phase shift angle of 45 degrees.

In general, by incorporating a switching amplifier or a transistor such a filter may require smaller and less bulky high inductance inductors, and the circuit may be simpler to design and better suited for induction machine frequencies below 10 kHz. The phase shift can be achieved by a high-pass filter with the oscillator frequency, f, in the unit Hz, given by:

$$f=(2\pi RC)^{-1}(2N)^{-0.5}\ldots$$

wherein R is resistor resistance in ohms, C is capacitor inductance in farads, and N is an integer representing the number of RC feedback stages.

According to the invention, the phase-shift is not only used during to initiate rotor 120 rotation but also to improve the power output of an already rotating rotor 120 by producing a RMF more evenly with windings 30 degrees apart (6-phases) compared to 60 degrees with 3-phases. The phase shift may be achieved by 180-degree phase shift of the transistor and either a low-pass filter (negative phase) or high-pass filter (positive phase) between windings.

Moreover, cascading many RC networks may affect the accuracy of the phase-shift oscillator frequency that has to remain accurate according with the physical/geometrical angle separation of the windings corresponding to 6-phase electric signals.

Figure 6:
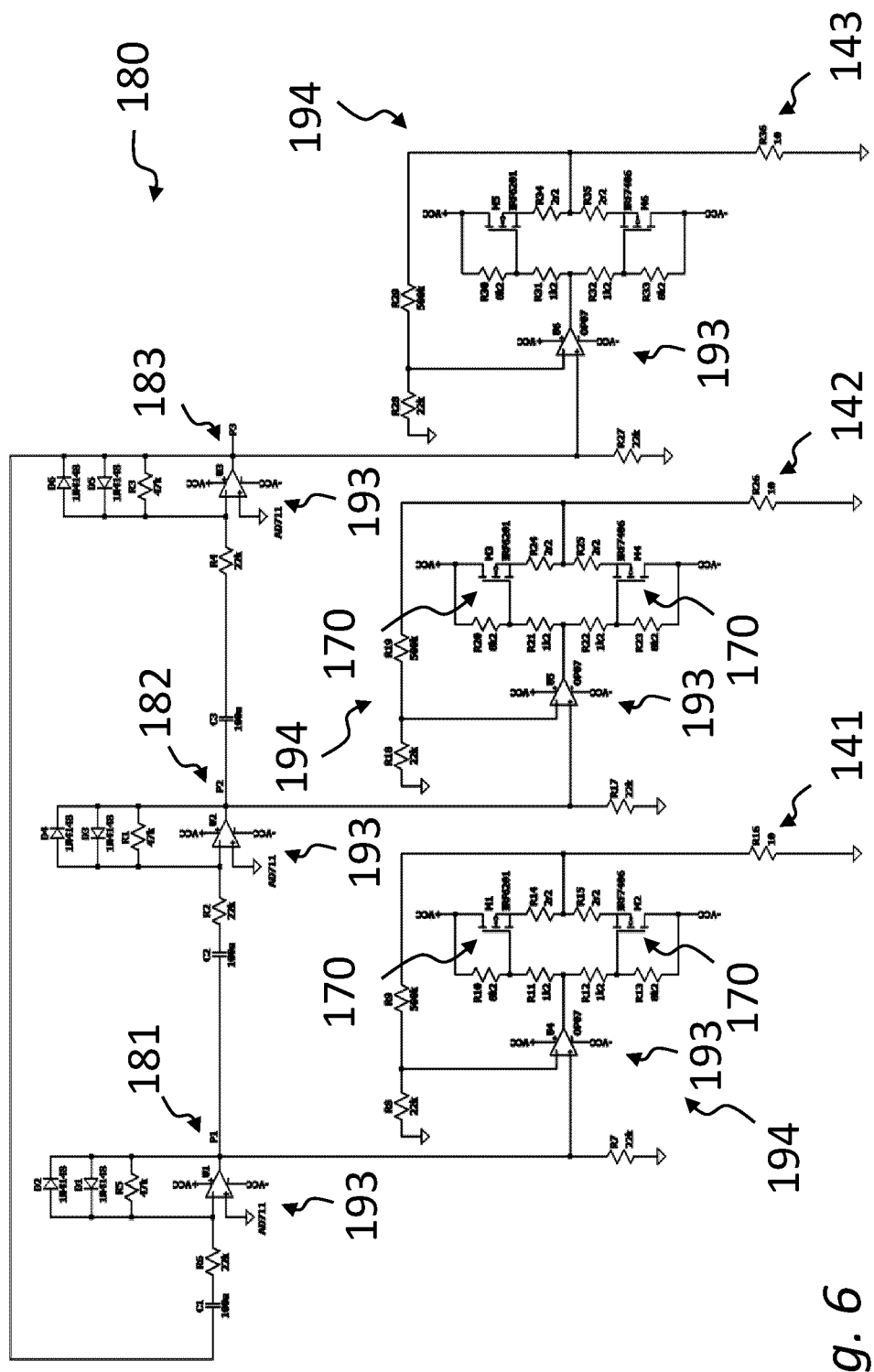
FIG. 6 shows a circuit diagram of an induction machine.

FIG. 6 shows a circuit diagram of an induction machine 100. The first 141, second 142, and third winding 143 of the stator 140 is herein schematically illustrated as a load resistance. In the illustrated circuit diagram, the first winding 141 is connected to a first node 181 of a phase-shift network 180 via a totem-pole circuit 194. Similarly, the second winding 142 is connected to a second node 182 of the phase-shift network 180 via a totem-pole circuit 194. Similarly, the third winding 143 is connected to a third node 183 of the phase-shift network 180 via a totem-pole circuit 194. The totem-pole circuits 194 may herein act as amplifiers, amplifying the electric signals from the first 181, second 182, and third 183 nodes of the phase-shift network 180. Each totem-pole circuit 194 comprises a pair of transistors 170, such as a pair of complementary transistors. The transistors 170 may be high-electron mobility transistors. The pair of transistors 170 may be configured to provide a push-pull output at a node between the transistors 170 of the pair of transistors. The push-pull output may provide the electric signal to the winding. The circuit diagram is configured to provide a first phase electric signal at the first node 181, a second phase electric signal at the second node 182, and a third phase electric signal at the third node 183. The difference between the first and second phase may correspond to an angle at which the second winding 142 is arranged relative to the first winding. The difference between the first and third phase may correspond to an angle at which the third winding 143 is arranged relative to the first winding. The circuit diagram further comprises amplifiers 193. The amplifiers 193 may herein comprise one or more transistors 170. A transistor 170 in an amplifier 193 may be a high-electron mobility transistor.

As easily understood, the circuit diagram may be expanded for a 6-phase induction machine 100. The phase-shift network 180 may be expanded to comprise a fourth, a fifth, and a sixth node of the phase-shift network 180. Similarly, the induction machine 100 may comprise a fourth, a fifth, and a sixth winding connected to the fourth, fifth, and sixth node of the phase-shift network 180, respectively. Each winding may be connected to its respective node of the phase-shift network 180 via a totem-pole circuit 194. The Nth phase electric signal at the Nth node of the phase-shift network 180 may differ from the first phase electric signal at the first node 181 of the phase-shift network 180 by an angle at which the Nth winding is arranged relative to the first winding.

As easily understood, the circuit diagram may be expanded for more than 6 phases.

Figure 7:
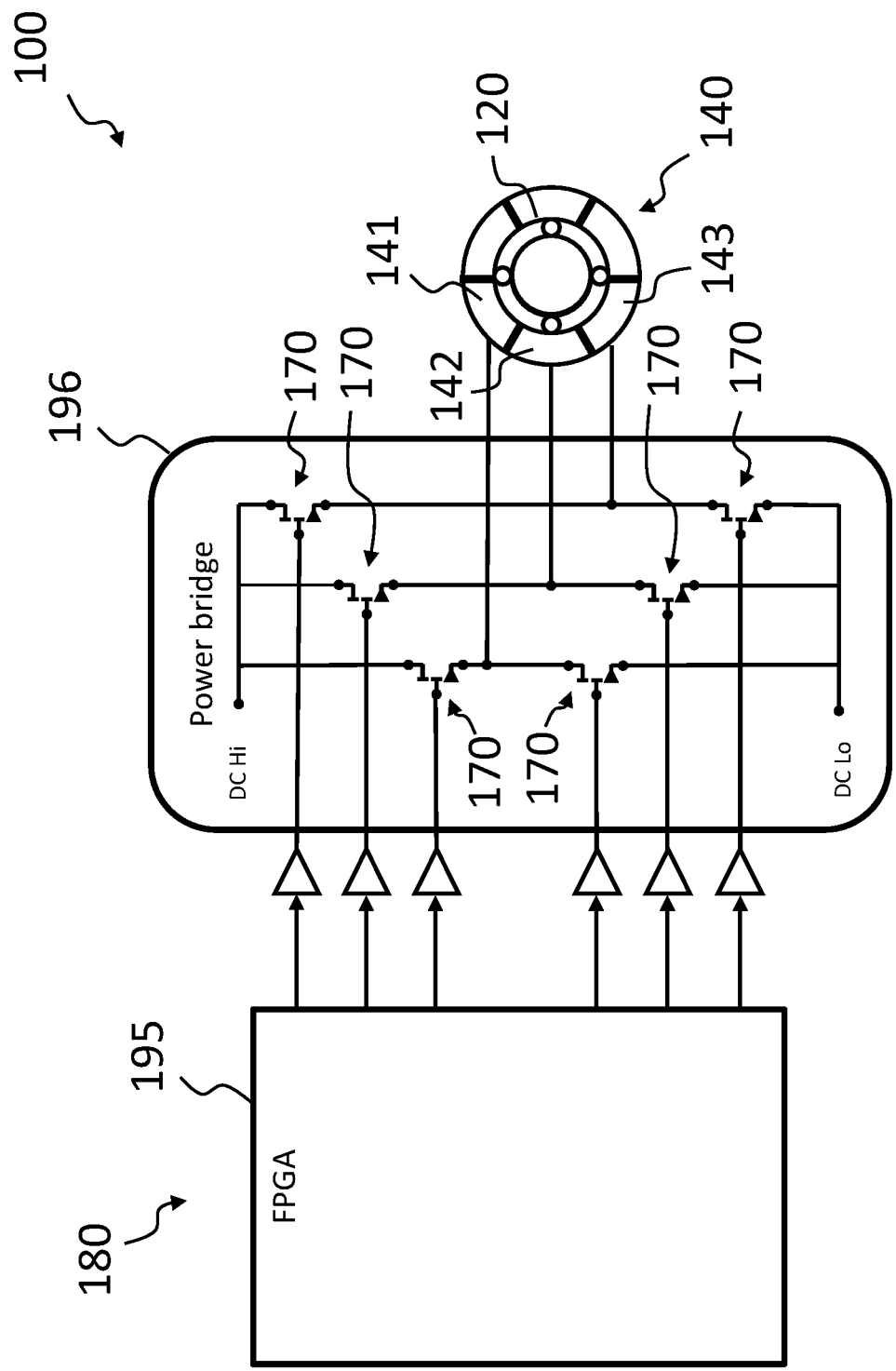
FIG. 7 shows a schematic illustration of an induction machine.

FIG. 7 shows a schematic illustration of an induction machine 100. As illustrated, the phase-shift network 180 may be implemented in a field-programmable gate array (FPGA) 195. The windings of the stator 140, in this case the first 141, second 142, and third winding 143 of the stator 140 are connected to the FPGA 195 via a power bridge 196, e.g. a gallium nitride power bridge 196. The power bridge 196 comprises transistors 170, wherein the windings of the stator 140 are connected to the nodes of the phase-shift network 180 via the transistors of the power bridge 196. The transistors 170 of the power bridge 196 may be high-electron mobility transistors.

Figure 5:
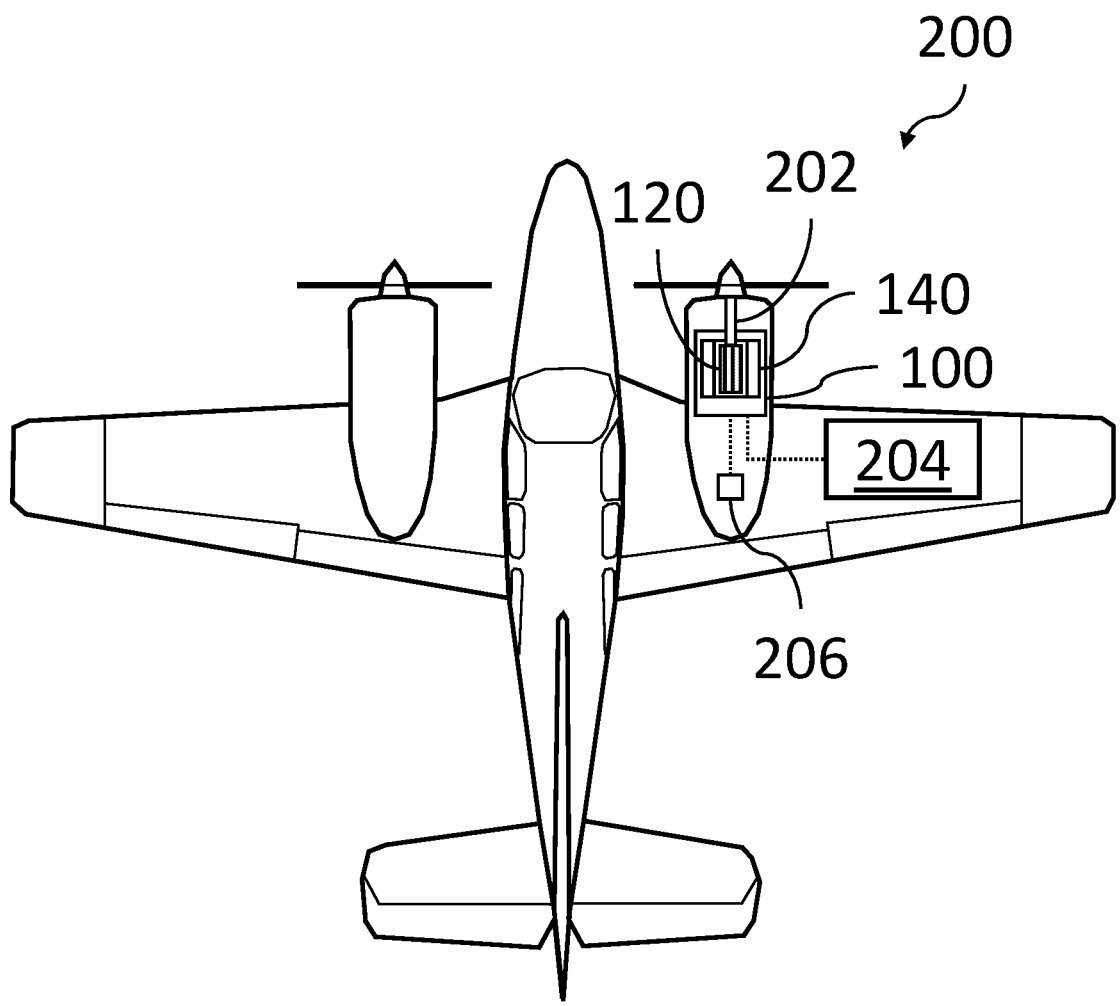
FIG. 5 shows a schematic illustration of an electric aircraft propulsion system.

FIG. 5 shows a top-view sketch of a two-engine, propeller powered, fixed-wing aircraft. The aircraft is shown to comprise an electric aircraft propulsion system 200. The electric aircraft propulsion system 200 comprises the induction machine 100. The electric aircraft propulsion system 200 further comprises an axle 202, physically connected and concentrically aligned with the rotor 120. The electric aircraft propulsion system 200 further comprises an electrical battery 204, electrically connected to the induction machine 100. The electric aircraft propulsion system 200 comprises control circuitry 206, electrically connected to the induction machine. The control circuitry 206 is configured to control the induction machine 100.

The electric aircraft propulsion system 200 may be configured for powering propeller or turbine type engines. The electric aircraft propulsion system 200 may further be configured to power a rotary-wing aircraft rotor.

Additionally, variations to the disclosed embodiments can be understood and effected by the skilled person in practicing the claimed invention, from a study of the drawings, the disclosure, and the appended claims.

The invention claimed is:
1. An induction machine comprising:
a rotor;
a stator; and
a phase-shift oscillator;

wherein the stator comprises:
   a first winding; and
   a second winding, arranged at a first angle relative to said first winding;
wherein the phase-shift oscillator comprises:
   a transistor, the transistor being a gallium nitride high-electron mobility transistor, GaN HEMT; and
   a phase-shift network;
wherein the first winding is connected to a first node of the phase-shift network and wherein the second winding is connected to a second node of the phase-shift network, wherein the phase-shift oscillator is configured to provide a first phase electric signal at the first node and a second phase electric signal at the second node, wherein a difference between the first and second phase corresponds to the first angle, and wherein a rotating magnetic field is formed without a capacitor.

2. The induction machine according to claim 1, wherein the first angle is 60 degrees.

3. The induction machine according to claim 1, wherein the stator further comprises a third winding, arranged at a second angle relative to said first winding, wherein the third winding is connected to a third node of the phase-shift network, wherein the phase-shift oscillator is configured to provide a third phase electric signal at the third node, wherein a difference between the first and third phase corresponds to the second angle.

4. The induction machine according to claim 3, wherein the second angle is 120 degrees.

5. The induction machine according to claim 1, wherein the first winding is a dual pole winding and wherein the second winding is a dual pole winding.

6. The induction machine according to claim 1, wherein the transistor is a power transistor.

7. The induction machine according to claim 1, wherein the transistor comprises GaN.

8. The induction machine according to claim 1, wherein the first winding and the second winding are configured to produce a magnetic field upon transmission of an electric current.

9. The induction machine according to claim 1, further comprising a current rectifier, wherein the current rectifier is configured for regenerative charging.

10. The induction machine according to claim 1, further comprising drive circuitry for driving the transistor of the phase-shift oscillator.

11. The induction machine according to claim 1, wherein the first winding and/or the second winding comprise a superconductor.

12. The induction machine according to claim 11, wherein the superconductor comprises V3Ga, Ga1-2xCuxAsxN, or NbN.

13. The induction machine according to claim 1, configured to receive an alternating current input.

14. The induction machine according to claim 1, wherein the phase-shift oscillator is configured to provide a 6-phase electric signal.

15. The induction machine according to claim 1, configured to receive a 3-phase input electric signal.

16. An electric aircraft propulsion system comprising:
   an induction machine according to claim 1;
   an axle, physically connected to and concentrically aligned with the rotor;
   an electrical battery, electrically connected to the induction machine; and
   control circuitry, electrically connected to the induction machine, wherein the control circuitry is configured to control the induction machine.

* * * * *